(12) United States Patent
Choi et al.

(10) Patent No.: US 9,018,991 B2
(45) Date of Patent: Apr. 28, 2015

(54) DATA RECOVERY CIRCUIT AND OPERATING METHOD THEREOF

(71) Applicants: SK Hynix Inc., Gyeonggi-do (KR); Industry-University Cooperation Foundation Hanyang University, Seoul (KR)

(72) Inventors: Hae-Rang Choi, Gyeonggi-do (KR); Yong-Ju Kim, Gyeonggi-do (KR); Oh-Kyong Kwon, Seoul (KR); Kang-Sub Kwak, Seoul (KR); Jun-Yong Song, Seoul (KR); Hyeon-Cheon Seol, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/106,817

(22) Filed: Dec. 15, 2013

(65) Prior Publication Data

US 2015/0042387 A1  Feb. 12, 2015

(30) Foreign Application Priority Data

Aug. 9, 2013  (KR) ......................... 10-2013-0094877

(51) Int. Cl.
*H03L 7/06* (2006.01)
*H03L 7/08* (2006.01)

(52) U.S. Cl.
CPC .................................... *H03L 7/0807* (2013.01)

(58) Field of Classification Search
USPC .......... 327/105–123, 141, 144–163; 331/1 A, 331/15–17; 375/373–376
See application file for complete search history.

(56) References Cited

U.S. PATENT DOCUMENTS

| 7,190,754 | B1* | 3/2007 | Chang et al. | 375/373 |
| 7,912,167 | B2* | 3/2011 | Saeki | 375/355 |
| 8,170,168 | B2* | 5/2012 | Oshima | 375/359 |
| 8,180,007 | B2* | 5/2012 | Iqbal et al. | 375/355 |
| 2002/0172304 | A1* | 11/2002 | Saze et al. | 375/340 |
| 2004/0165679 | A1* | 8/2004 | Kwak | 375/316 |
| 2007/0047686 | A1* | 3/2007 | Aoki et al. | 375/374 |
| 2011/0316600 | A1* | 12/2011 | Lin | 327/161 |
| 2012/0049910 | A1* | 3/2012 | Aoyama | 327/156 |
| 2012/0105115 | A1* | 5/2012 | Yamamoto et al. | 327/156 |
| 2012/0177162 | A1* | 7/2012 | Nedovic et al. | 375/373 |
| 2013/0329843 | A1* | 12/2013 | Takeuchi | 375/375 |

FOREIGN PATENT DOCUMENTS

| KR | 1020050011760 | 1/2005 |
| KR | 1020060059530 | 6/2006 |

* cited by examiner

*Primary Examiner* — Brandon S Cole
(74) *Attorney, Agent, or Firm* — IP & T Group LLP

(57) ABSTRACT

A data recovery circuit may include a data sampling unit suitable for sampling source data including an edge data using data clocks and an edge clock, a data extraction unit suitable for extracting the edge data from sampled data outputted from the data sampling unit, a control signal generation unit suitable for generating a phase control signal in response to the edge data, and a multi-clock control unit suitable for controlling phases of the data clocks and the edge clock in response to the phase control signal.

19 Claims, 13 Drawing Sheets

DATA RECOVERY CIRCUIT AND OPERATING METHOD THEREOF

CROSS-REFERENCE TO RELATED APPLICATION

The present application claims priority of Korean Patent Application No. 10-2013-0094877, filed on Aug. 9, 2013, which is incorporated herein by reference in its entirety.

BACKGROUND

1. Field

Exemplary embodiments of the present invention relate to semiconductor design technology, and more particularly, to a data recovery circuit.

2. Description of the Related Art

A semiconductor apparatus including double data rate synchronous DRAM (DDR SDRAM) performs various operation in response to external data and a clock. The dock is used for various purposes within the semiconductor apparatus, but is specially used to synchronize data. Accordingly, a corresponding high-speed clock is necessary to process high-speed data. It is, however, very difficult to transmit the high-speed data and the high-speed clock from a transmission circuit to a reception circuit at the same time and to minutely control the timing. Thus, with advances in technology, only data is transmitted and recovered without transmitting both data and a clock. A circuit for enabling this transmission operation is a data recovery circuit.

FIGS. 1 and 2 are timing diagrams illustrating an overall operation of a typical data recovery circuit. An example that 10 data DAT is inputted as one set is described below, for purpose of description.

FIG. 1 shows 10 edge clocks CLK_E and 10 data docks CLK_D corresponding to the respective data DAT. The 10 edge clocks CLK_E are clocks to be placed at the points of time at which the respective data DAT shift, and the 10 data clock CLK_D are clocks to be placed in the middle of the respective data DAT.

The edge clocks CLK_E and the data clocks CLK_D that are internally generated may not be placed at the points of time at which the data DAT shifts and in the middles of the data DAT when being initially generated. Accordingly, the edge clocks CLK_E are first controlled through a locking operation so that the edge clocks CLK_E can be placed at the points of time at which the data DAT shifts. The locking operation means an operation of detecting points of time at which the data DAT shifts and controlling the edge clocks CLK_E to be placed at the points of time at which the data DAT shifts. Since the data clock CLK_D is generated to have a specific phase difference from the edge clock CLK_E, the data clocks CLK_D are naturally placed in the middles of the data DAT when the locking operation is completed. Accordingly, when the locking operation is completed, a data recovery circuit may sample the data DAT in response to the data clock CLK_D and perform a data recovery operation.

On the other hand, the data DAT does not always have a data value that continues to toggle/oscillate like a clock. That is, as shown in FIG. 2, sections ① and ② in which the same data value as a previous data value is maintained may be generated in the 10 data DAT. Accordingly, in the sections ① and ② in which the shift operation of the datum DAT is not performed, a locking operation, which is an operation of detecting a point of time at which the datum DAT shifts and an operation of controlling the phase of the edge clock CLK_E, is meaningless.

As described above, in order to recover the data DAT, a plurality of the edge clocks CLK_E and a plurality of the data clocks CLK_D are used. To this end, a clock generation circuit for generating the plurality of edge clocks CLK_E and the plurality of data clocks CLK_D is to be included in the data recovery circuit. However, since the clock generation circuit occupies a relatively wide area and consumes relatively great power, it may become a burden on circuit design of the data recovery circuit. Furthermore, an operation of controlling phases is to be performed on the plurality of edge clocks CLK_E and the plurality of data clocks CLK_D. Here, when taking into consideration the area of a circuit for the operation of controlling phases, a burden on the design of the data recovery circuit may inevitably increase.

SUMMARY

Exemplary embodiments of the present invention are directed to providing a data recovery circuit capable of minimizing the number of clocks used in a data recovery operation.

In accordance with an embodiment of the present invention, a data recovery circuit may include a data sampling unit suitable for sampling source data including an edge data using data clocks and an edge clock, a data extraction unit suitable for extracting the edge data from sampled data outputted from the data sampling unit, a control signal generation unit suitable for generating a phase control signal in response to the edge data, and a multi-clock control unit suitable for controlling phases of the data clocks and the edge clock in response to the phase control signal.

Preferably, the edge data may include a signal generated by detecting a relationship between a point of time at which the source data shift and the phase of the edge clock.

In accordance with another embodiment of the present invention, a data recovery system may include a controller suitable for generating source data comprising an edge data shifting from a first logic level to a second logic level, and a data recovery circuit suitable for recovering the source data by performing on the source data a locking operation in response to an edge clock, corresponding to the edge data, and performing a sampling operation in response to data docks, corresponding to the source data.

Preferably, the controller may include an edge insertion unit suitable for inserting the edge data into a recovery target data in response to edge location information, a data serialization unit suitable for outputting the source data to the data recovery circuit by serializing inserted data outputted from the edge insertion unit, and an edge information providing unit suitable for providing the edge insertion unit with edge location information corresponding to a location of the edge data in the source data.

Preferably, the edge information providing unit may provide the edge location information to the data recovery circuit.

In accordance with yet another embodiment of the present invention, a data recovery method may include generating source data comprising an edge data shifting from a first logic level to a second logic level, generating edge location information by detecting a location of the edge data in the source data, moving an edge clock to the location of the edge data in response to the edge location information, performing a locking operation by detecting a point of time at which the edge data shifts in response to the edge clock, controlling phases of data clocks in response to the locking operation, and recovering the source data by sampling the source data in response to the data clocks.

Preferably, the generating of the edge location information may include resetting the edge location information, detecting the location of the edge data, and updating the edge location information based on a result of the detection.

In accordance with exemplary embodiments of the present invention, a data recovery circuit may reduce the area of a circuit for generating clocks by minimizing the number of clocks used when a data recovery operation is performed.

DETAILED DESCRIPTION

Figure 1:
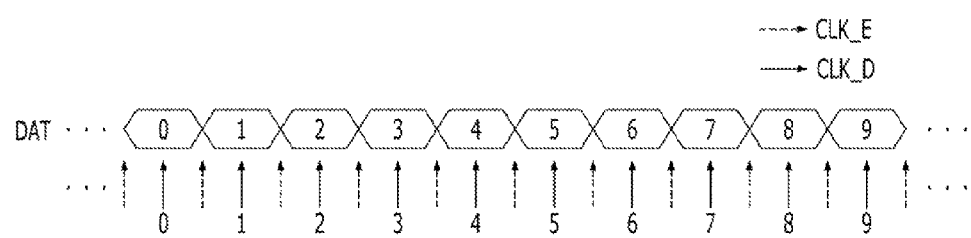
FIGS. 1 and 2 are timing diagrams illustrating an overall operation of a typical data recovery circuit.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In addition, a singular form may include a plural form as long as it is not specifically mentioned in a sentence.

Figure 3:
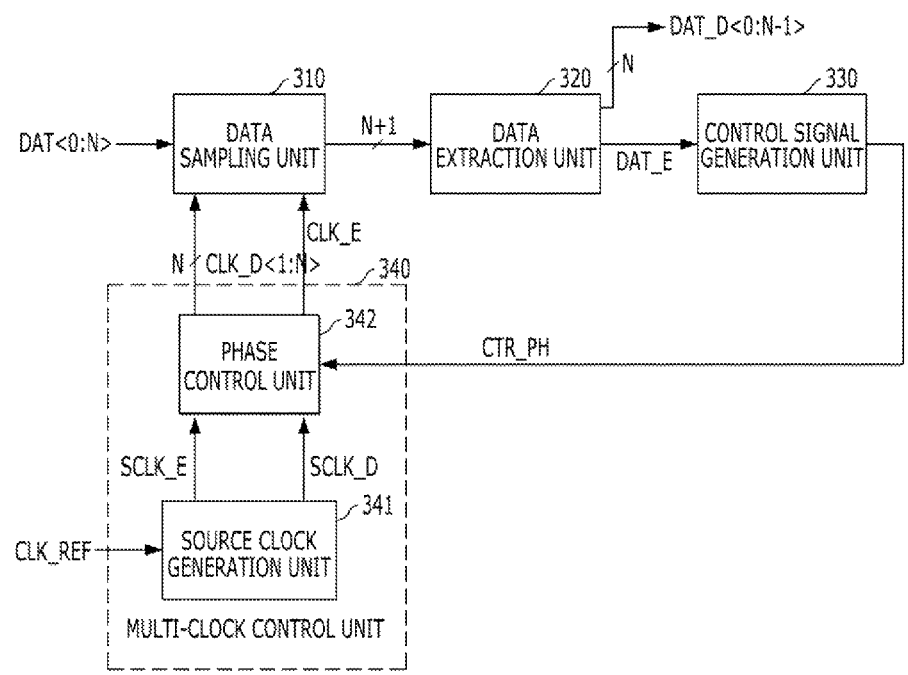
FIG. 3 is a block diagram of a data recovery circuit in accordance with an embodiment of the present invention.

FIG. 3 is a block diagram of a data recovery circuit in accordance with a first embodiment of the present invention. An example in which (N+1) (N is a natural number) data DAT<0:N> is inputted as one set is described with reference to FIG. 3, for convenience of description.

Referring to FIG. 3, the data recovery circuit includes a data sampling unit 310, a data extraction unit 320, a control signal generation unit 330, and a multi-clock control unit 340.

The data sampling unit 310 samples the (N+1) data DAT<0:N> using N data clocks CLK_D<1:N> and one edge dock CLK_E. The (N+1) data DAT<0:N> includes N data DAT_D<0:N−1> and one edge datum DAT_E. The N data DAT_D<0:N−1> are target data to be recovered (hereinafter referred to as 'recovery target data'). Thus, the N recovery target data DAT_D<0:N−1> of the (N+1) data DAT<0:N> is sampled by the respective N data clocks CLK_D<1:N>, and the one edge datum DAT_E is sampled by the one edge clock CLK_E. Here, the edge datum DAT_E is a signal that is generated by detecting a relationship between a point of time at which datum shifts and the phase of the edge clock CLK_E.

The data extraction unit 320 performs an extraction operation on the data, sampled by the data sampling unit 310, to be divided into the N recovery target data DAT_D<0:N−1> and the one edge datum DAT_E. Here, the recovery target data DAT_D<0:N−1> outputted from the data extraction unit 320 may be transferred to a relevant data processing circuit as recovery-completed data.

The control signal generation unit 330 generates a phase control signal CTR_PH corresponding to the edge datum DAT_E. Here, the edge datum DAT_E may have a value that has been sampled in response to the edge clock CLK_E. A locking operation may be performed using the phase control signal CTR_PH corresponding to the edge datum DAT_E.

The multi-clock control unit 340 controls the phases of the N data clocks CLK_D<1:N> and the one edge clock CLK_E in response to the phase control signal CTR_PH and includes a source clock generation unit 341 and a phase control unit 342. Here, the source clock generation unit 341 generates a source data clock. SCLK_D, that is, the source clock of the N data clocks CLK_D<1:N> and a source edge clock SCLK_E, that is, the source clock of the one edge clock CLK_E in response to a reference clock CLK_REF. Furthermore, the phase control unit 342 generates the N data clocks CLK_D<1:N> and the one edge clock CLK_E by controlling the phases of the source data clock SCLK_D and the source edge clock SCLK_E in response to the phase control signal CTR_PH. For reference, the one edge clock CLK_E may be generated using the N data clocks CLK_D<1:N> without separately generating the source edge clock SCLK_E.

The data recovery circuit in accordance with an embodiment of the present invention may perform a locking operation in response to the one edge dock CLK_E using the (N+1) data DAT<0:N> that includes the N recovery target data DAT_D<0:N−1> and the one edge datum DAT_E. That is, the number of docks used in a locking operation may be minimized.

The data DAT<0:N> inputted to the data recovery circuit may be configured in various forms depending on the circuit design. FIG. 3 illustrates an example in which only one edge datum is included in the (N+1) data DAT<0:N>, but the number of edge data may be changed depending on the type in which the edge data is inserted.

Figure 4A:
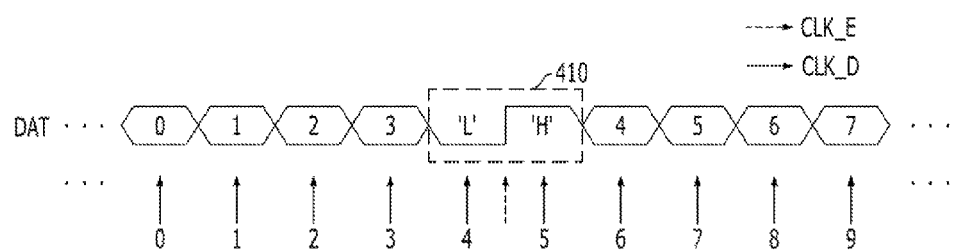
FIGS. 4A and 4B are diagrams illustrating a first edge data type.
Figure 4B:
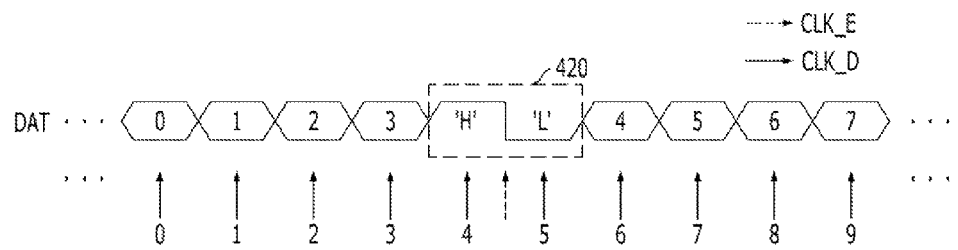

FIGS. 4A and 4B are diagrams illustrating a first edge data type.

Figure 2:
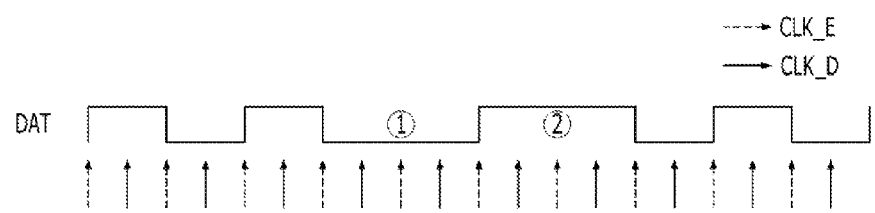

First, FIG. 4A illustrates an example in which 10 data DAT is inputted as one set. From among the 10 data, 8 data is recovery target data 0, 1, 2, 3, 4, 5, 6 and 7, and the remaining two data is edge data 410. In other words, in the first edge data type, the 2 edge data 410 is inserted into the 8 data, and the edge data 410 includes a data form that shifts from logic 'Low (L)' to logic 'High (H)'. Like in FIG. 4A, in FIG. 4B, 2 edge data 420 is inserted into 8 data. The edge data 420 includes a data form that shifts from logic 'H' to logic 'L'.

As can be seen from FIGS. 4A and 4B, the edge clock CLK_E is placed at a point of time at which the edge data 410 and 420 shifts. If the point of time at which the edge data 410 and 420 shifts is detected in response to the edge clock CLK_E, a locking operation may be performed. For reference, data sampled in response to the '4' data clock CLK_D and the '5' data clock CLK_D is edge data, and the edge data may be used when an edge detection operation is performed FIGS. 5A and 5B are diagrams illustrating a second edge data type.

Figure 5A:
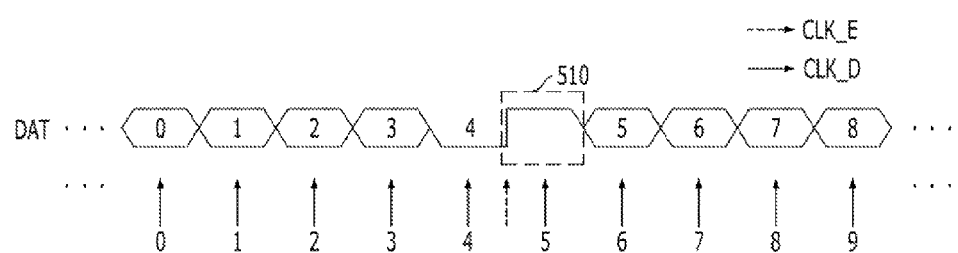
FIGS. 5A and 5B are diagrams illustrating a second edge data type.

First, FIG. 5A illustrates an example in which 10 data DAT is inputted as one set. From among the 10 data, 9 data is recovery target data 0, 1, 2, 3, 4, 5, 6, 7, and 8, and the remaining one datum is an edge datum 510. In other words, in the second edge data type, the one edge datum 510 is inserted into the 9 data, and the edge datum 510 has a phase opposite to that of a previous datum DAT, which is the '4' datum DAT. In FIG. 5A, the edge datum 510 is set as a logic 'H' value because the '4' datum DAT has a logic 'L' value. In FIG. 5B, the edge datum 520 is set as a logic 'L' value because the '4' datum DAT has a logic 'H' value.

Figure 5B:
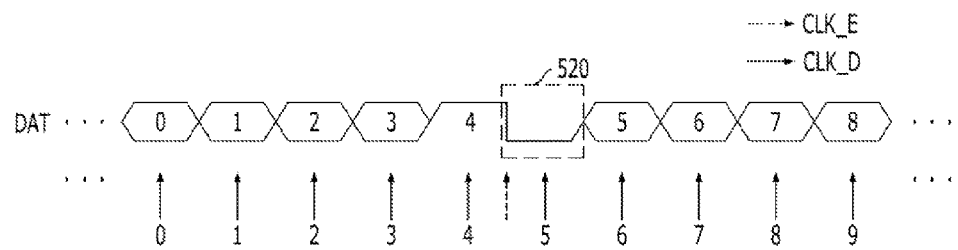

Each of the edge data 510 and 520 of FIGS. 5A and 5B includes a shifting data form with the '4' datum DAT, that is, the previous datum DAT, like in FIGS. 4A and 4B. In the embodiments of FIGS. 5A and 5B, data values of the edge data 510 and 520 have been illustrated as being set depending on previous data DAT, but may be set depending on data DAT posterior to the edge data 510 and 520 according to the circuit design.

Figure 6A:
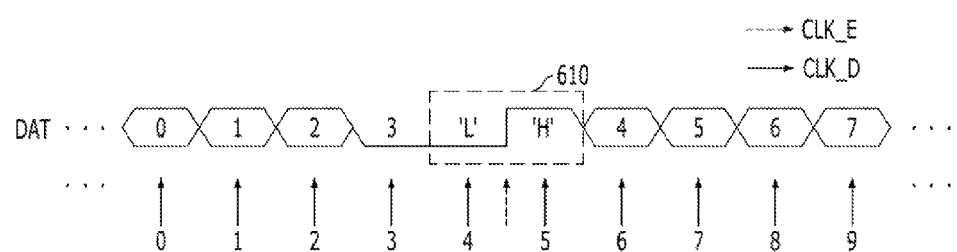
FIGS. 6A and 6B are diagrams illustrating a third edge data type.
Figure 6B:
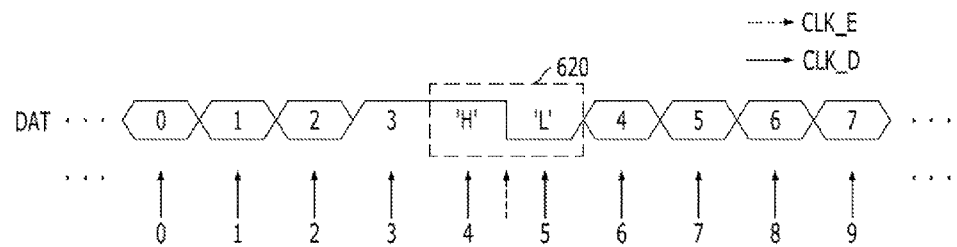

FIGS. 6A and 6B are diagrams illustrating a third edge data type.

First, FIG. 6A illustrates an example in which 10 data DAT is inputted as one set. From among the 10 data, 8 data is recovery target data 0, 1, 2, 3, 4, 5, 6, and 7, and the remaining two data is edge data 610. In other words, in the third edge data type, the two edge data 610 is inserted into the 8 data. The edge data 610 has data values depending on a phase of a previous datum DAT, which is a phase of the '3' datum DAT. In FIG. 6A, since the '3' datum DAT has a logic 'L' value, the edge data 610 has a data form that shifts from logic 'L' to logic 'H'. As in FIG. 6A, in FIG. 6B, 2 edge data 620 are inserted into 8 data. Since the '3' datum DAT has a logic 'H' value, the edge data 620 has a data form that shifts from logic 'H' to logic 'L'.

Each of the edge data 610 and 620 of FIGS. 6A and 6B also includes a shifting data form. In particular, in a third edge data type, such as those of FIGS. 6A and 6B, inter-symbol interference (ISI) may be reduced.

In accordance with an embodiment of the present invention, an edge datum may be inserted in various types. A locking operation may be performed through an edge detection operation using the inserted edge datum and the one edge clock CLK_E.

As described above, in accordance with an embodiment of the present invention, a locking operation is performed using one edge dock CLK_E. In this case, the initial location of the edge dock CLK_E is very important. In each of FIGS. 4 to 6, an example in which an edge datum shifts between the '4' data clock CLK_D and the '5' data dock CLK_D is described. In this case, a locking operation may be performed if the edge clock CLK_E is placed between the '4' data clock CLK_D and the '5' data clock CLK_D.

In an embodiment of the present invention, an example in which a locking operation may be performed although an edge datum is not placed in a specific location is described below.

Figure 7:
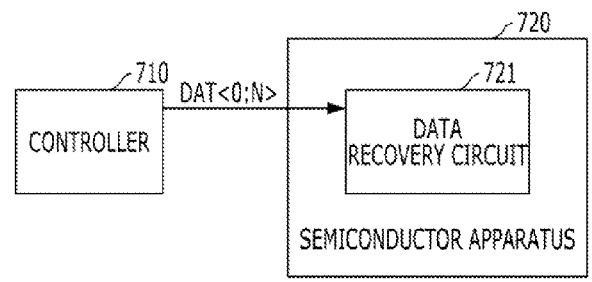
FIG. 7 is a block diagram a data recovery system in accordance with an embodiment of the present invention.

FIG. 7 is a block diagram a data recovery system in accordance with a first embodiment of the present invention.

Referring to FIG. 7, the data recovery system includes a controller 710 and a semiconductor apparatus 720.

The controller 710 generates data DAT<0:N> having first to third edge data types, such as those described above. The semiconductor apparatus 720 receives the data DAT<0:N> from the controller 710 and restores data through a data sampling operation, such as that of FIG. 3.

Figure 8:
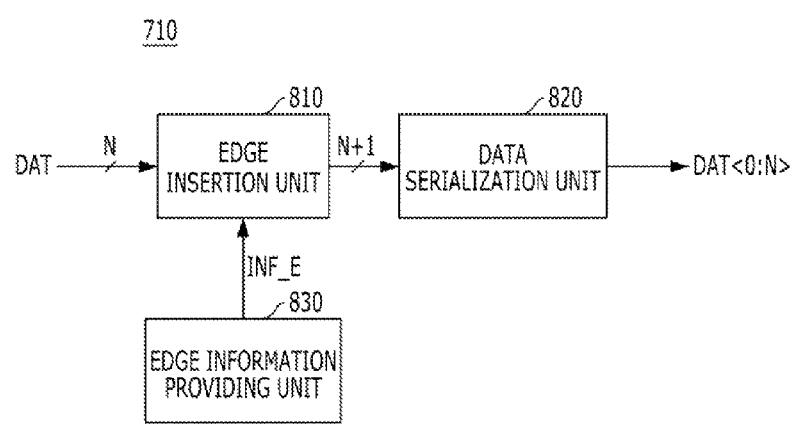
FIG. 8 is a block diagram illustrating parts of the elements of a controller 710 shown in FIG. 7.

FIG. 8 is a block diagram illustrating parts of the elements of the controller 710 shown in FIG. 7.

Referring to FIG. 8, the controller 710 includes an edge insertion unit 810, a data serialization unit 820, and an edge information providing unit 830.

The edge insertion unit 810 generates (N+1) data by inserting an edge datum into a position corresponding to edge location information INF_E in N data DAT that is received in parallel. For reference, the number of edge data is illustrated as being one. The data serialization unit 820 serializes the (N+1) parallel data and outputs the serialized data. Meanwhile, the edge insertion unit 810 receives the edge location information INF_E from the edge information providing unit 830. The edge location information INF_E has information corresponding to the location into which the edge datum is inserted.

The data recovery system in accordance with an embodiment of the present invention may generate data into which an edge datum has been inserted and transfer the generated data to a data recovery circuit.

Referring back to FIG. 3, a construction, such as that of FIG. 3 shows an example in which the location into which an edge datum be inserted has been set. That is, the controller 710 of FIG. 7 is to generate data by inserting an edge datum into a predetermined location, and a data recovery circuit 721 is to sample the edge datum, which is inserted into the predetermined location, in response to an edge clock CLK_E. In accordance with an embodiment of the present invention, however, a data recovery circuit may autonomously detect the location of an edge datum. A construction in which the location into which an edge datum will be inserted is not preset that is, which an edge datum is inserted into an unspecific location, is described below with reference to FIG. 9.

Figure 9:
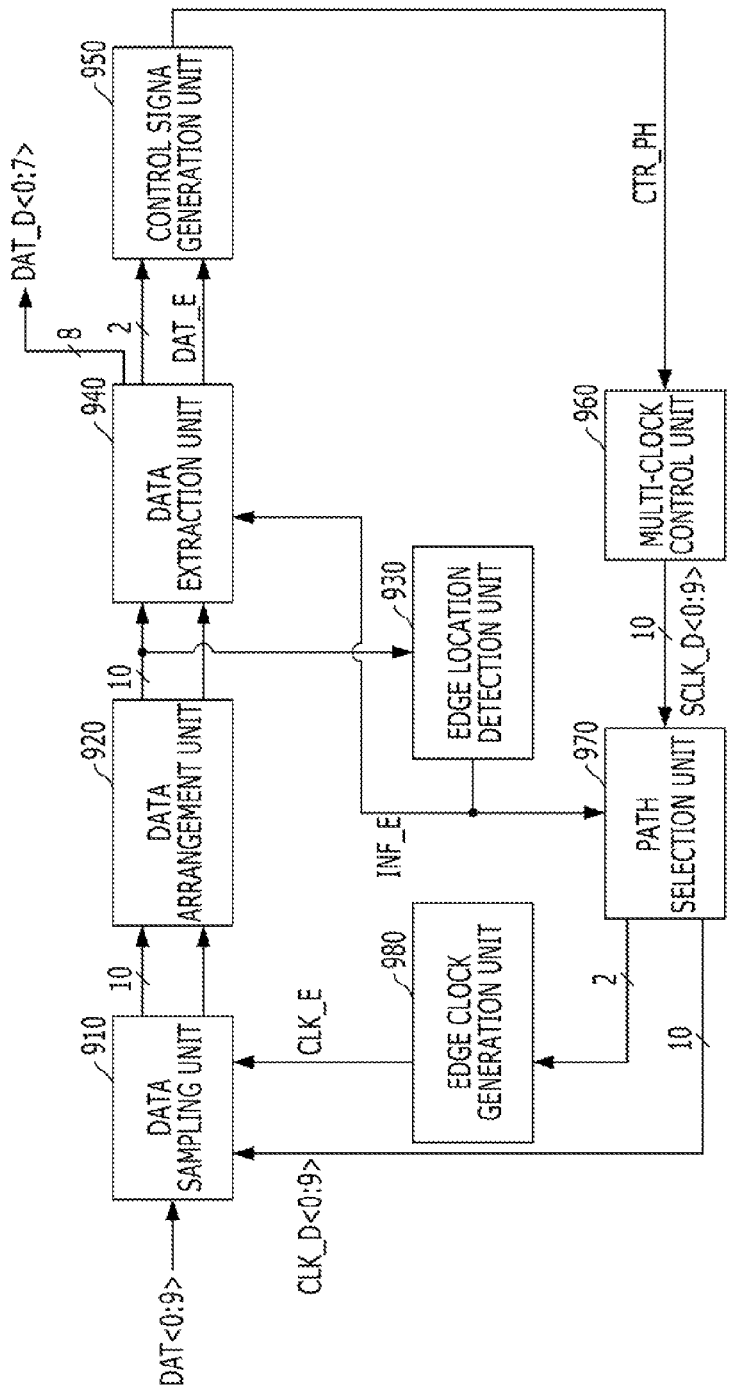
FIG. 9 is a block diagram of a data recovery circuit in accordance with an embodiment of the present inventions

FIG. 9 is a block diagram of a data recovery circuit in accordance with an embodiment of the present invention. An example in which 10 data DAT<0:9> is inputted as one set is described with reference to FIG. 9, for convenience of description. From among the 10 data, 8 data is recovery target data DAT_D<0:7>, and the remaining 2 data is edge data used to detect an edge.

Referring to FIG. 9, the data recovery circuit includes a data sampling unit 910, a data arrangement unit 920, an edge location detection unit 930, a data extraction unit 940, a control signal generation unit 950, a multi-clock control unit 960, a path selection unit 970, and an edge clock generation unit 980.

The data sampling unit 910 samples the 10 data DAT<0:9> using 10 data clocks CLK_D<0:9> and one edge clock CLK_E. The data arrangement unit 920 parallelizes the sampling data and outputs the data in parallel. Data inputted to the data arrangement unit 920 is data sampled in response to the data clocks CLK_D<0:9> and the edge clock CLK_E having different phases. Thus, the data arrangement unit 920 receives the data, rearranges the received data in response to a predetermined signal (not shown), and outputs the rearranged data.

The edge location detection unit 930 receives the arranged data and detects information about the location of an edge datum from the received data. As will be described later, the operation of the edge location detection unit 930 may be performed prior to a locking operation, and the operations of the data extraction unit 940 and the path selection unit 970 are controlled in response to edge location information INF_E generated from the edge location detection unit 930.

First, prior to a description of elements in the rear of the edge location detection unit 930, the edge location detection unit 930 is described in detail below.

Figure 10:
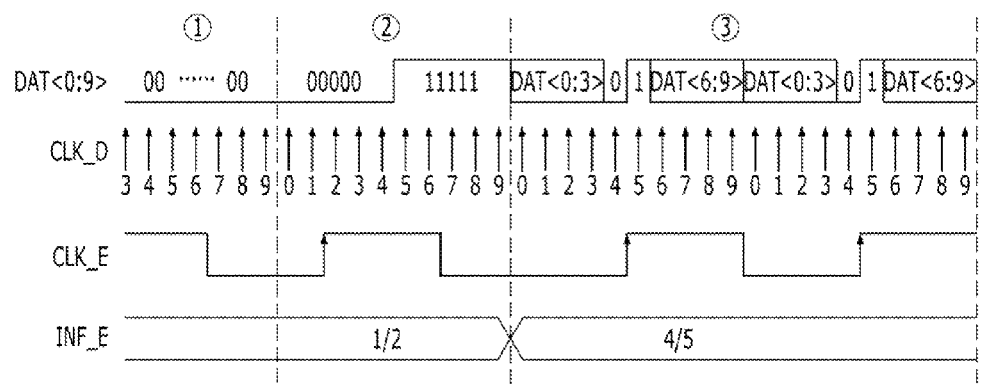
FIG. 10 is a timing diagram illustrating the operation of an edge location detection unit 930 of FIG. 9.

FIG. 10 is a timing diagram illustrating the operation of the edge location detection unit 930 of FIG. 9. FIG. 10 illustrates 10 data DAT<0:9>, data clocks CLK_D, an edge clock CLK_E, and edge location information INF_E. The operation of the edge location detection unit 930 is classified into a standby operation section 1̂, an edge detection section 2̂, and a locking operation and data input operation section 3̂, for convenience of description.

Referring to FIGS. 9 and 10, first, in the standby operation section 1̂ the data DAT<0:9> is inputted as '0000000000'. In the standby operation section 1̂, the edge location detection unit 930 may be reset depending on the circuit design. To reset the edge location detection unit 930 means that the edge location information INF_E stored in the edge location detection unit 930 is initialized.

Next, in the edge detection section 2̂, the data DAT<0:9> is inputted as '0000011111'. Here, when the data DAT<0:9> is '0000011111', it means that data corresponding to a '4' data clock. CLK_D and a '5' data clock CLK_D is edge data. This setting may vary depending on the circuit design.

Meanwhile, the edge location detection unit 930 receives the data DAT<0:9> '0000011111' and updates the edge location information INF_E using the received data DAT<0:9>. As can be seen from FIG. 10, the edge location information INF_E is updated from '1/2' to '4/5'. Here, when the edge location information INF_E is '1/2', it means that data corresponding to a '1' data clock CLK_D and a '2' data clock CLK_D is edge data, and when the edge location information INF_F is '4/5', it means that data corresponding to a '4' data clock CLK_D and a '5' data clock CLK_D is edge data. Accordingly, the edge clock CLK_D is controlled so that it moves between the '4' data clock CLK_D and the '5' data clock CLK_D based on the edge location information INF_F of '4/5'.

Next, in the locking operation and data input operation section 3̂, a locking operation is performed using the edge clock CLK_E, and a data recovery operation is performed through a sampling operation using the data clocks CLK_D.

Referring back to FIG. 9, the data extraction unit 940 extracts 8 recovery target data DAT_D<0:7> and one edge datum DAT_E by classifying the data arranged by the data arrangement unit 920. The control signal generation unit 950 generates a phase control signal CTR_PH using the one edge datum DAT_E sampled in response to the edge dock CLK_E and two edge data sampled in response to the data clocks CLK_D. The control signal generation unit 950 in accordance with an embodiment of the present invention generates the phase control signal CTR_PH using data sampled in response to the edge dock CLK_E and data docks neighboring the edge clock CLK_E, that is, data clocks located on the left and right sides of the edge clock CLK_E (for example, the '4' data dock and the '5' data clock of FIG. 10). For example, the phase of the edge datum DAT_E and the phase of the edge clock CLK_E may be detected by performing XOR operation on a datum sampled in response to the edge clock CLK_E and a datum sampled in response to a data clock (the '4' data clock of FIG. 10) prior to the edge clock CLK_E and performing XOR operation on a datum sampled in response to the edge clock CLK_E and a datum sampled in response to a data clock (the '5' data clock of FIG. 10) posterior to the edge clock CLK_E. This means that a locking operation may be performed.

The multi-clock control unit 960 generates 10 source data clocks SCLK_D<0:9> in response to the phase control signal CTR_PH. Furthermore, the path selection unit 970 controls an output path of the source data clocks SCLK_D<0:9> in response to the edge location information INF_E. In particular, the path selection unit 970 controls the output path so that a source data clock of the edge clock CLK_E, from among the 10 source data clocks SCLK_D<0:9>, may be transferred to the edge clock generation unit 980. The edge clock generation unit 980 generates the one edge clock CLK_E using two of the source data clocks SCLK_D<0:9>. The edge clock CLK_E generated as described above is placed between the two source data clocks.

A data recovery circuit in accordance with an embodiment of the present invention may internally detect the location of an edge datum.

Figure 11A:
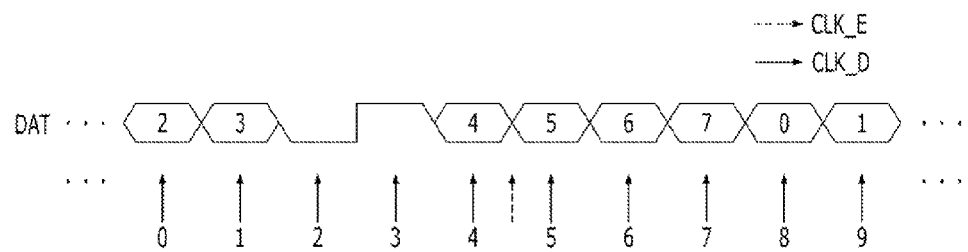
FIGS. 11A and 11B are timing diagrams illustrating operations before and after edge location information INF_E of FIG. 9 are incorporated.
Figure 11B:
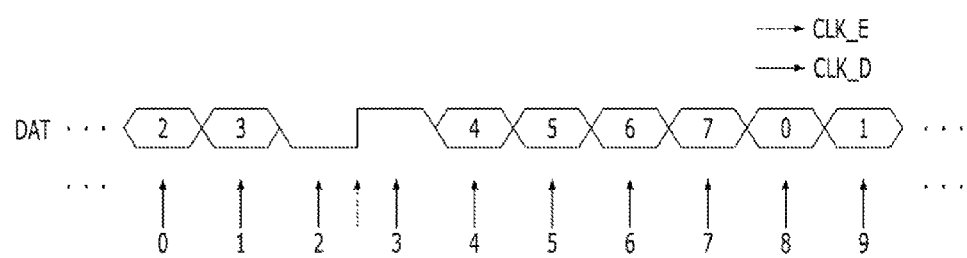

FIGS. 11A and 11B are timing diagrams illustrating operations before and after the edge location information INF_E of FIG. 9 are incorporated. FIG. 11A is a timing diagram before the edge location information INF_E is incorporated, and FIG. 11B is a timing diagram after the edge location information INF_E is incorporated.

FIGS. 11A and 11B illustrate examples in which the path selection unit 970 of FIG. 9 fixes and outputs 10 source data clocks SCLK_D<0:9> as 10 data clocks CLK_D<0:9>, and outputs only two source data clocks corresponding to the edge clock CLK_E, from among the 10 source data clocks SCLK_D<0:9>, through a changed path after an edge detection operation. As can be seen from FIG. 11B, after the edge location information INF_E is incorporated, the locations of the 10 data clocks CLK_D<0:9> remain intact, but only the edge clock CLK_E is moved to a location into which an edge datum has been inserted.

Figure 12:
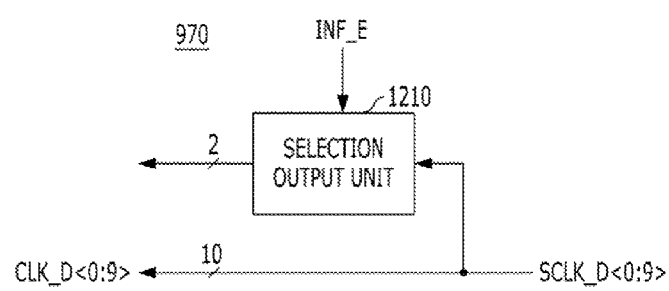
FIG. 12 is a detailed block diagram of a path selection unit 970 of FIG. 9, which is related to the operations of FIGS. 11A and 11B.

FIG. 12 is a detailed block diagram of the path selection unit 970 of FIG. 9, which is related to the operations of FIGS. 11A and 11B.

Referring to FIG. 12, the path selection unit 970 includes a selection output unit 1210. The selection output unit 1210 outputs 2 source data clocks corresponding to the edge clock CLK_E from among the 10 source data clocks SCLK_D<0:9> in response to the edge location information INF_E. As can be seen from FIG. 12, the 10 source data clocks SCLK_D<0:9> are fixed without change and are outputted as the 10 data clocks CLK_D<0:9>, and the 2 source data clocks may be selectively outputted. As a result, the 2 data clocks outputted from the selection output unit 1210 may be selected in response to the edge location information INF_E. This means that the location of the edge clock CLK_E may be controlled in response to the edge location information INF_E.

Figure 13A:
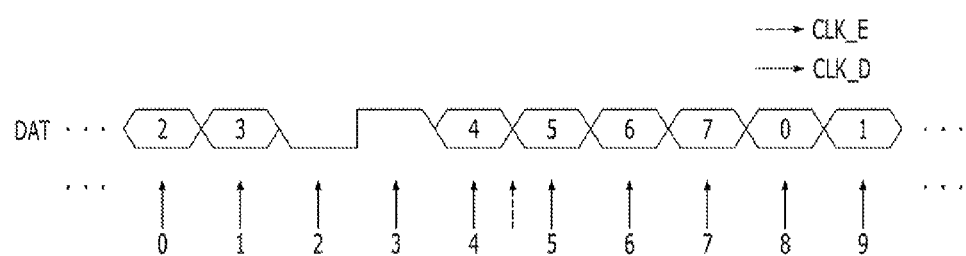
FIGS. 13A and 13B are other timing diagrams illustrating operations before and after the edge location information INF_E of FIG. 9 are incorporated.
Figure 13B:
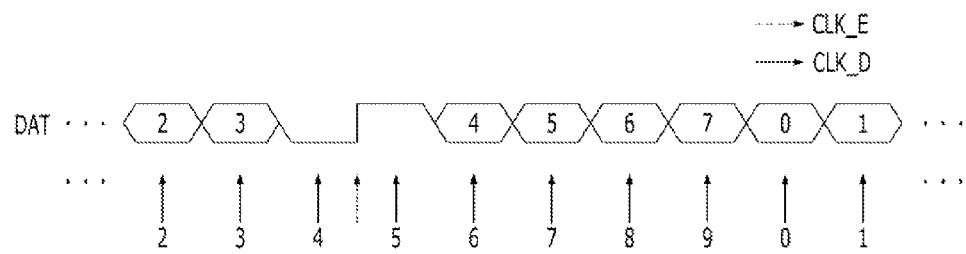

FIGS. 13A and 13B are other timing diagrams illustrating operations before and after the edge location information INF_E of FIG. 9 are incorporated. FIG. 13A is a timing diagram before the edge location information INF_E is incorporated, and FIG. 13B is a timing diagram after the edge location information INF_E is incorporated.

FIGS. 13A and 13B illustrate examples in which the path selection unit 970 of FIG. 9 forms the 10 data clocks CLK_D<0:9> and the edge clock CLK_E into one group, changes the path of the one group after an edge detection operation, and outputs the one group through the changed path. It is described as an example that the edge clock CLK_E is fixed between a '4' data clock CLK_D and a '5' data clock CLK_D. As can be seen from FIG. 13B, after the edge location information INF_E is incorporated, the 10 data clocks CLK_D<0:9>, together with the edge clock CLK_E, are moved on the basis of the edge clock CLK_E.

Figure 14:
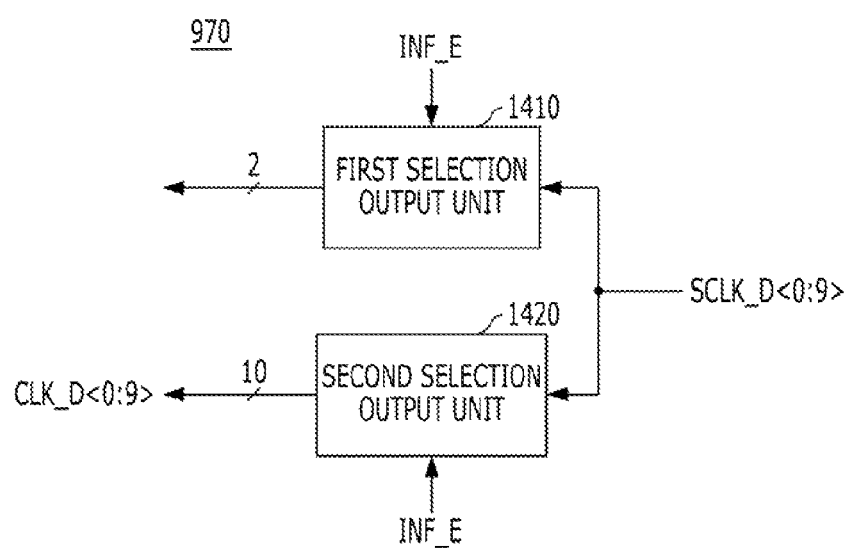
FIG. 14 is another detailed block diagram of the path selection unit 970 of FIG. 9, which is related to the operations of FIGS. 13A and 13B.

FIG. 14 is another detailed block diagram of the path selection unit 970 of FIG. 9, which is related to the operations of FIGS. 13A and 13B.

Referring to FIG. 14, the path selection unit 970 includes first and second selection output units 1410 and 1420. The first selection output unit 1410 outputs two of the 10 source data clocks SCLK_D<0:9> in response to the edge location information INF_E. The second selection output unit 1420 outputs the 10 data clocks CLK_D<0:9> by controlling an output path of the 10 source data clocks SCLK_D<0:9> in response to the edge location information INF_E. As a result, the first and the second selection output units 1410 and 1424 may select the output path of the 10 source data clocks SCLK_D<0:9> in response to the edge location information INF_E. This means that the locations of the edge clock CLK_E and the data clocks CLK_D may be controlled in response to the edge location information INF_E.

Figure 15:
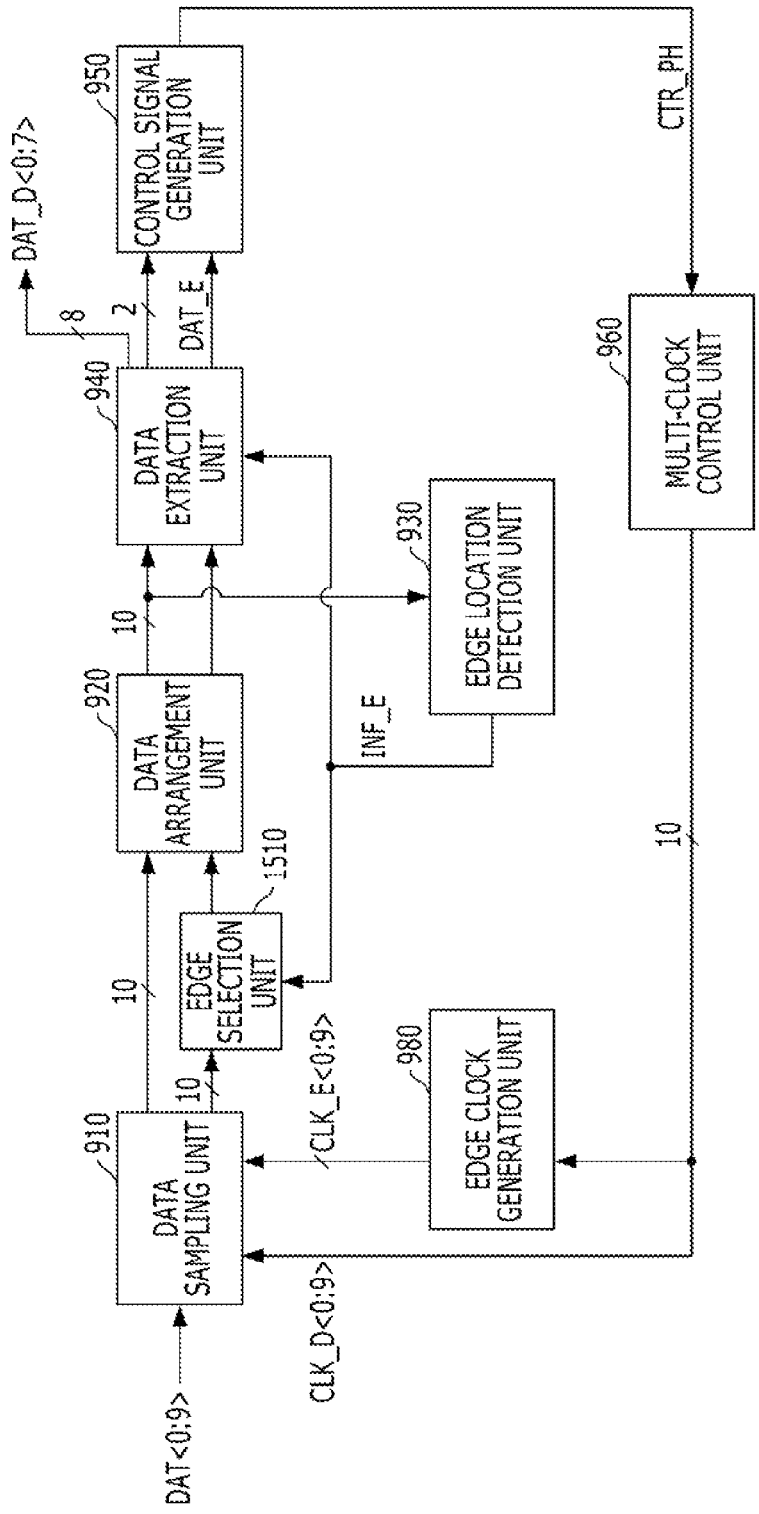
FIG. 15 is a block diagram of a data recovery circuit in accordance with an embodiment of the present invention.

FIG. 15 is a block diagram of a data recovery circuit in accordance with an embodiment of the present invention. Elements of FIG. 15 corresponding to the respective elements of FIG. 9 are assigned the same reference numerals, and a detailed description of the operations of the elements is omitted for convenience of description. In FIG. 15, the path selection unit 970 of FIG. 9 is removed, and an edge selection unit 1510 is added.

Referring to FIG. 15, the multi-clock control unit 960 generates 10 data clocks CLK_D<0:9>. The edge clock generation unit 980 generates 10 edge clocks CLK_E<0:9> using the 10 data clocks CLK_D<0:9>. The data sampling unit 910 samples data DAT<0:9> in response to the 10 data clocks CLK_D<0:9> and samples the edges of the respective data DAT<0:9> in response to the 10 edge clocks CLK_E<0:9>. The edge selection unit 1510 selects an edge datum, corresponding to edge location information INF_E, from the edge data sampled in response to the 10 edge clocks CLK_E<0:9> and transfers the selected edge datum to the data arrangement unit 920.

In the embodiment of FIG. 9, the edge location information INF_E has been incorporated before data is sampled, whereas in the embodiment of FIG. 15, the edge location information INF_E is incorporated after data is sampled. In accordance with the embodiment of FIG. 15, the area of a circuit and power consumption may be reduced.

Figure 16:
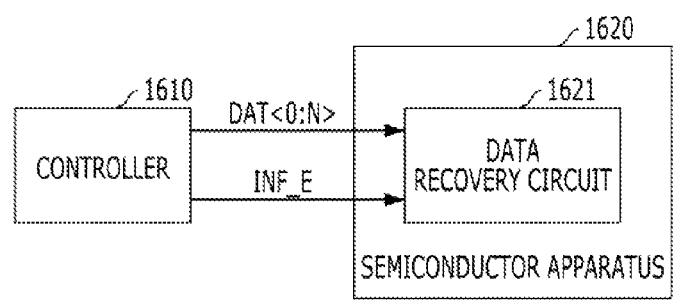
FIG. 16 is a block diagram of a data recovery system in accordance with an embodiment of the present invention.

FIG. 16 is a block diagram of a data recovery system in accordance with an embodiment of the present invention, Referring to FIG. 16, the data recovery system includes a controller 1610 and a semiconductor apparatus 1620.

The controller 1610 may be configured as FIG. 8. The controller 1610 generates data DAT<0:N>, including edge data, and edge location information INF_E. That is, the data recovery system in accordance with an embodiment of the present invention may transfer the edge location information INF_E, which is generated from the controller 1610, to the data recovery circuit 1621 of the semiconductor apparatus 1620. In this case, the data recovery circuit 1621 of the semiconductor apparatus 1620 may not include an additional circuit for detecting edge data, for example, the edge location detection unit 930 of FIG. 9. Instead, the data recovery circuit 1621 may include a latch circuit for storing the edge location information INF_E received from the controller 1610.

In the data recovery system in accordance with an embodiment of the present invention the semiconductor apparatus 1620 may perform a data recovery operation using the edge location information INF_E received from the controller 1610.

As described above, the data recovery system in accordance with an embodiment of the present invention may generate data including edge data, and the data recovery circuit may perform a locking operation and a data recovery operation using the edge data. Furthermore, since the number of clocks used when performing a locking operation may be minimized, the area of a circuit may be reduced, and power consumption may also be reduced.

Furthermore, the area of a semiconductor apparatus using a data recovery circuit may be reduced because the area of the data recovery circuit may be reduced and the area of a system including the semiconductor apparatus may be reduced.

While the present invention has been described with respect to the specific embodiments, it will be apparent to those skilled in the art that various changes and modifications may be made without departing from the spirit and scope of the invention as defined in the following claims.

What is claimed is:

1. A data recovery circuit, comprising:
a data sampling unit suitable for sampling source data comprising N data and one edge data using N data clocks and one edge clock;
a data extraction unit suitable for extracting the N data and the one edge data from sampled data outputted from the data sampling unit;
a control signal generation unit suitable for generating a phase control signal in response to the one edge data; and
a multi-clock control unit suitable for controlling phases of the N data clocks and the one edge clock in response to the phase control signal.

2. The data recovery circuit of claim 1, wherein the edge data comprises a signal generated by detecting a relationship between a point of time at which the source data shift and the phase of the edge clock.

3. The data recovery circuit of claim 1, wherein the edge data includes two or more sequential data having different logic levels.

4. The data recovery circuit of claim 1, wherein the edge data includes one or more sequential data having a logic level set depending on a logic level of the neighboring source data.

5. The data recovery circuit of claim 1, wherein the multi-clock control unit comprises:
a clock generation unit suitable for generating source clocks in response to a reference clock; and
a phase control unit suitable for generating the data clocks and the edge clock by controlling phases of the source clocks in response to the phase control signal.

6. A data recovery system, comprising:
a controller suitable for generating source data comprising one edge data shifting from a first logic level to a second logic level and N data, wherein the one edge data is inserted in a preset location of the N data; and
a data recovery circuit suitable for recovering the source data by performing a locking operation on the source data in response to an edge clock, corresponding to the one edge data, and performing a sampling operation in response to data clocks, corresponding to the source data.

7. The data recovery system of claim 6, wherein the source data includes a group of a plurality of data and the one edge data includes one or more sequential data in the group.

8. The data recovery system of claim 6, wherein the data recovery circuit comprises:
a data sampling unit suitable for sampling the source data in response to the data clocks and the edge clock;
an edge location detection unit suitable for detecting edge location information in sampled data outputted from the data sampling unit;
a data extraction unit suitable for extracting the one edge data from the sampled data in response to the edge location information;
a control signal generation unit suitable for generating a phase control signal in response to the one edge data;
a multi-clock control unit suitable for generating source clocks in response to the phase control signal; and
a path selection unit suitable for selectively outputting the source clocks as the data clocks and the edge clock in response to the edge location information.

9. The data recovery system of claim 6, wherein the controller comprises:
an edge insertion unit suitable for inserting the one edge data into a recovery target data in response to edge location information;
a data serialization unit suitable for outputting the source data to the data recovery circuit by serializing inserted data outputted from the edge insertion unit; and
an edge information providing unit suitable for providing the edge insertion unit with edge location information corresponding to a location of the one edge data in the source data.

10. The data recovery system of claim 9, wherein the edge information providing unit provides the edge location information to the data recovery circuit.

11. The data recovery system of claim 10, wherein the data recovery circuit comprises:
a data sampling unit suitable for sampling the source data in response to the data clocks and the edge clock;
a data extraction unit suitable for extracting the one edge data from sampled data outputted from the data sampling unit, in response to the edge location information;
a control signal generation unit suitable for generating a phase control signal in response to the one edge data;
a multi-clock control unit suitable for generating source clocks in response to the phase control signal; and
a path selection unit suitable for selectively outputting the source clocks as the data clocks and the edge clock in response to the edge location information.

12. The data recovery system of claim 8, further comprising a data arrangement unit suitable for parallelizing output data of the data sampling unit and output the sampled data at a set point of time.

13. The data recovery system of claim 8, further comprising an edge clock generation unit suitable for receiving the source clocks selectively outputted from the path selection unit and generating the edge clock.

14. The data recovery system of claim 6, wherein the one edge data includes two sequential data having the first and second logic levels, respectively.

15. The data recovery system of claim 6, wherein the one edge data has the first or second logic level in response to the second or first logic level of the neighboring source data.

16. A data recovery method, comprising:
generating source data comprising one edge data shifting from a first logic level to a second logic level and N data, wherein the one edge data is inserted in a preset location of the N data;
generating edge location information by detecting a location of the one edge data in the source data;
moving an edge clock to the location of the edge data in response to the edge location information;
performing a locking operation by detecting a point of time at which the edge data shifts in response to the edge clock;
controlling phases of data clocks in response to the locking operation; and
recovering the source data by sampling the source data in response to the data clocks.

17. The data recovery method of claim 16, wherein the moving of the edge clock comprises:
fixing the data clocks; and
moving the edge clock to the location of the edge data.

18. The data recovery method of claim 16, wherein the moving of the edge clock comprises:
forming the data clocks and the edge clock into one group; and
moving the group to the location of the edge data based on the edge clock.

19. The data recovery method of claim 16, wherein the generating of the edge location information comprises:
resetting the edge location information;
detecting the location of the edge data; and
updating the edge location information based on a result of the detecting.

* * * * *